(12) United States Patent
Judkins

(10) Patent No.: US 8,455,806 B2
(45) Date of Patent: Jun. 4, 2013

(54) PHOTOVOLTAIC ASSEMBLY FOR USE IN DIFFUSE WEATHER CONDITIONS AND RELATED METHODS

(75) Inventor: Zachary Judkins, Berkeley, CA (US)

(73) Assignee: Sunpower Corporation, San Jose, CA (US)

( * ) Notice: Subject to any disclaimer, the term of this patent is extended or adjusted under 35 U.S.C. 154(b) by 729 days.

(21) Appl. No.: 12/688,989

(22) Filed: Jan. 18, 2010

(65) Prior Publication Data

US 2011/0178641 A1 Jul. 21, 2011

(51) Int. Cl.
| G01J 1/20 | (2006.01) |
| F24J 2/38 | (2006.01) |
| H01L 35/02 | (2006.01) |
| H01L 25/00 | (2006.01) |

(52) U.S. Cl.
USPC ........ 250/203.4; 126/573; 126/600; 136/230; 136/243

(58) Field of Classification Search
USPC ........ 250/203.4; 136/230, 244–246; 126/569, 126/573, 574, 600, 601, 620–624, 701
See application file for complete search history.

(56) References Cited

U.S. PATENT DOCUMENTS

| 4,149,523 A | 4/1979 | Boy-Marcotte et al. |
| 4,345,582 A | 8/1982 | Aharon |
| 4,429,178 A | 1/1984 | Prideaux et al. |
| 4,765,309 A | 8/1988 | Legge |
| 5,228,924 A | 7/1993 | Barker et al. |
| 5,445,177 A | 8/1995 | Laing et al. |
| 5,758,938 A | 6/1998 | Osterwisch |
| 6,058,930 A | 5/2000 | Shingleton |
| 6,089,224 A | 7/2000 | Poulek |
| 6,253,632 B1 | 7/2001 | Poulek |
| 6,563,040 B2 | 5/2003 | Hayden et al. |
| 6,722,357 B2 | 4/2004 | Shingleton |
| 7,252,083 B2 | 8/2007 | Hayden |
| 8,119,963 B2 * | 2/2012 | Scanlon ........ 250/203.4 |

(Continued)

FOREIGN PATENT DOCUMENTS

| AU | 55904/86 | 3/1989 |
| ES | 2294903 | 4/2008 |
| FR | 2461331 | 1/1981 |
| JP | 60169173 | 9/1985 |
| WO | WO-2007/038760 A2 | 4/2007 |
| WO | WO-2007/128401 A1 | 11/2007 |

OTHER PUBLICATIONS

"U.S. Appl. No. 12/021,682, Stackable Tracking Solar Collector Assembly, filed Jan. 29, 2008", 86 pgs.
"Powertracker", *PVStrom Energy Systems Promotional Material*, (2008), 12 pgs.
Shugar, Daniel S., et al., "U.S. Appl. No. 12/021,772, Tracking Solar Collector Assembly, filed Jan. 29, 2008", 46 pgs.
Shugar, Daniel S., et al., "Commercialization of a Value-Engineered Photovoltaic Tracking System", *25th PVSC*, May 13-17, 1996, 4 pgs.

*Primary Examiner* — Que T Le
*Assistant Examiner* — Don Williams
(74) *Attorney, Agent, or Firm* — Knobbe Martens Olson & Bear LLP

(57) ABSTRACT

A method includes collecting site specific data, collecting field data at a site of an array of photovoltaic members, determining a current tracked irradiance of the array of photovoltaic members, calculating predicted irradiance for multiple orientations based on the site specific data and the sensed field data, or sensing an actual irradiance for multiple orientations. The method further includes determining a maximum predicted irradiance from the calculated predicted irradiance or a maximum actual irradiance from the sensed irradiance. The method further includes comparing the maximum predicted irradiance or the maximum sensed irradiance with the current tracked irradiance, and re-orienting the array of photovoltaic members to an orientation having the maximum predicted or actual irradiance if the maximum predicted or actual irradiance is greater than the current tracked irradiance.

20 Claims, 4 Drawing Sheets

U.S. PATENT DOCUMENTS

| | | |
|---|---|---|
| 2004/0238025 A1 | 12/2004 | Shingleton |
| 2004/0261955 A1 | 12/2004 | Shingleton et al. |
| 2005/0109384 A1 | 5/2005 | Shingleton et al. |
| 2008/0230047 A1 | 9/2008 | Shugar et al. |
| 2008/0245360 A1 | 10/2008 | Almy et al. |
| 2009/0000613 A1 | 1/2009 | Edwards et al. |
| 2009/0025708 A1 | 1/2009 | Shingleton et al. |
| 2009/0032014 A1 | 2/2009 | Meydbray |
| 2010/0218758 A1* | 9/2010 | Guha et al. .................. 126/601 |

* cited by examiner

PHOTOVOLTAIC ASSEMBLY FOR USE IN DIFFUSE WEATHER CONDITIONS AND RELATED METHODS

TECHNICAL FIELD

The application relates generally to a photovoltaic (PV) array. More particularly it relates to a photovoltaic assembly for use in diffuse weather conditions.

BACKGROUND

Photovoltaic devices are used to collect energy from the sun and convert it to electrical energy. Solar trackers are mechanical assemblies used to track the sun through its daily solar path, minimizing the angle of incidence of light between rays coming from the sun and surface normal to the PV device. As the sun moves across the sky, the photovoltaic devices move to follow the sun across the sky. However, simply tracking the sun across the sky fails to take into account other conditions which affect the amount of irradiation that can be collected by the photovoltaic devices.

SUMMARY

A method includes collecting site specific data, collecting field data at a site of an array of photovoltaic members, determining a current tracked irradiance of the array of photovoltaic members, calculating a predicted irradiance for multiple orientations based on the site specific data and the sensed field data, and determining a maximum predicted irradiance from the calculated predicted irradiance. The method further includes comparing the maximum predicted irradiance with the current tracked irradiance, and re-orienting the array of photovoltaic members to an orientation having the maximum predicted irradiance if the maximum predicted irradiance is greater than the current tracked irradiance.

In another option, a method includes rotating an array of photovoltaic members at including tracking movement of the sun, where the array of photovoltaic members are located at a site, sensing a current tracked irradiance of the rotating array of photovoltaic members, and sensing a plurality of irradiance readings from a plurality of fixed irradiance sensors, the fixed irradiance sensors are mounted at different rotational orientations. The method further includes determining a maximum irradiance and maximized irradiance orientation from the plurality of irradiance readings, and re-orienting the array of photovoltaic members to the maximized irradiance orientation if the maximized irradiance is greater than the current tracked irradiance.

In another option, the method includes rotating an array of photovoltaic members including tracking movement of the sun, where the array of photovoltaic members are located at a site sensing a current tracked irradiance of the rotating array of photovoltaic members, sensing at least one irradiance reading from at least one non-rotated fixed irradiance sensor, the fixed irradiance sensors are mounted at different rotational orientations. The method further includes re-orienting the array of photovoltaic members to a non-rotated position if the at least one irradiance reading is greater than the current tracked irradiance.

In yet another option, an apparatus includes a server that has site specific data, and the server includes a processor. The apparatus further includes a photovoltaic array located at a site, where the photovoltaic array including a plurality of photovoltaic members. The photovoltaic array includes a tracker controller, and the tracker controller is communicatively coupled with the server, where the tracker controller is configured to re-orient the photovoltaic array based on instructions from the server. The apparatus further includes one or more sensors located at the site, and the one or more sensors are communicatively coupled with the server. The one or more sensors provide real-time sensed field data to the server. The processor is configured to calculate a predicted irradiance for multiple orientations of the photovoltaic array, where the predicted irradiance is determined from site specific data and real-time sensed field data. The processor is further configured to calculate a maximum predicted irradiance and to compare the maximum predicted irradiance with a current tracked irradiance. The processor communicates an orientation to the tracker controller based on the maximum predicated irradiance if the maximum predicted irradiance is greater than the current tracked irradiance.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

BRIEF DESCRIPTION OF THE DRAWINGS

Embodiments of the invention may be best understood by referring to the following description and accompanying drawings which illustrate such embodiments. In the drawings.

DESCRIPTION OF THE EMBODIMENTS

The following detailed description includes references to the accompanying drawings, which form a part of the detailed description. The drawings show, by way of illustration, specific embodiments in which the present photovoltaic assemblies and methods may be practiced. These embodiments, which are also referred to herein as "examples," are described in enough detail to enable those skilled in the art to practice the present photovoltaic assemblies and methods. The embodiments may be combined, other embodiments may be utilized or structural or logical changes may be made without departing from the scope of the present photovoltaic assemblies and methods. The following detailed description is, therefore, not to be taken in a limiting sense, and the scope of the present photovoltaic assemblies and methods is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

Figure 1:
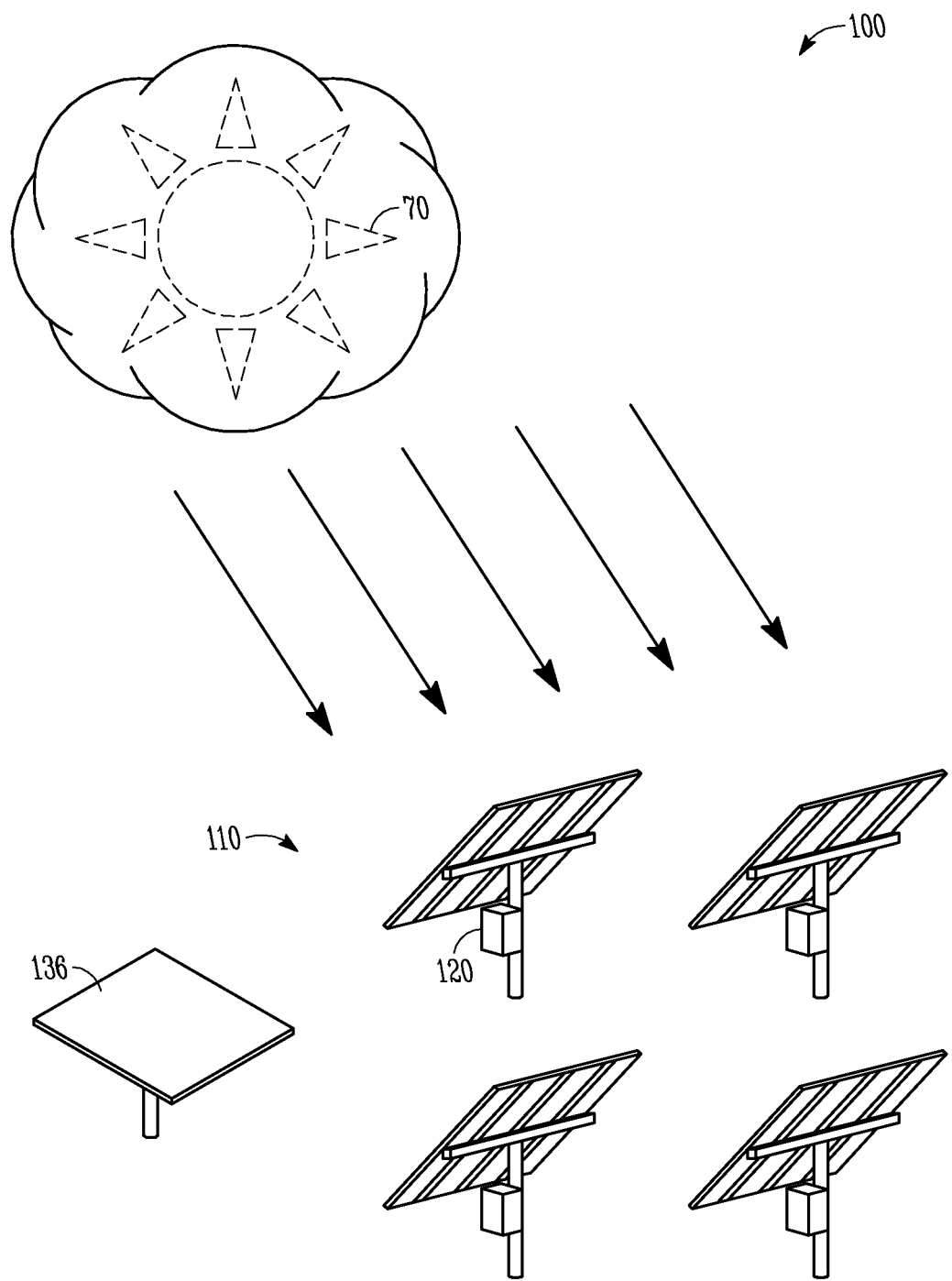
FIG. 1 illustrates a block diagram of a photovoltaic system according to one or more embodiments.

FIG. 1 illustrates a site 100 of photovoltaic members 110, including solar tracking members, which comprise an array of photovoltaic members. The array of photovoltaic members 110 includes, but is not limited to, laminates, modules, or a combination thereof. One or more of the photovoltaic members 110, for instance each of the photovoltaic members 110, includes a tracker controller 120. The tracker controller 120 allows for the photovoltaic members 110 to track or to follow the sun 70 as the sun 70 moves across the sky throughout the day. The tracker controller 120 computes a position of the sun 70, and a desired orientation of the photovoltaic members, for instance, based on a date, time, latitude, and longitude. In an option, the photovoltaic array is single axis array and the tracker controller 120 is a single axis tracker controller. In another option, the photovoltaic array is a dual axis array, or may include other degrees of freedom.

Figure 2:
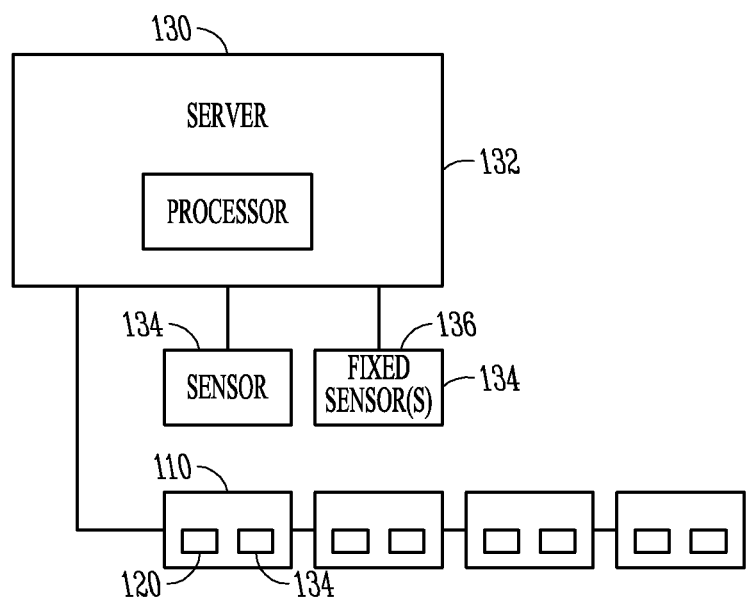
FIG. 2 illustrates a block diagram of a photovoltaic system according to one or more embodiments.

Referring to FIG. 2, a server 130 is provided at the site that has site specific data, such as, but not limited to, latitude, longitude, elevation, time zone, or Linke turbidity. The tracker controller 120 is communicatively coupled with the server 130, which includes a processor 132, where the tracker controller 120 is configured to re-orient the photovoltaic array based on instructions from the server 130.

The server 130 stores an algorithm for calculating a rotational orientation for maximization of the plane of array irradiance based on real time in field measurements and site specific data. The server 130 can also include a memory unit. The memory unit may store data and/or instructions, and may comprise any suitable memory, such as a dynamic random access memory (DRAM). A machine-readable medium can be further included that stores a set of instructions (e.g., software) embodying any one, or all, of the methodologies for described herein. The software may reside, completely or at least partially, within memory unit and/or within the processor 130.

Figure 3:
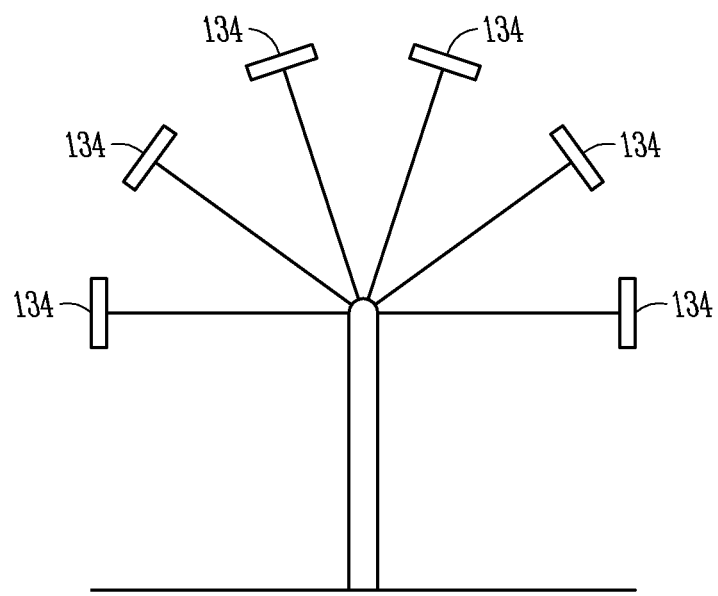
FIG. 3 illustrates a side view of a photovoltaic member according to one or more embodiments.

One or more sensors 134 are located at the site, and the one or more sensors 134 are communicatively coupled with the server 130. The one or more sensors 134 provide real-time sensed field data to the server, such as, but not limited to, ambient temperature, relative humidity, irradiance, global horizontal irradiance, or combinations thereof. In an option, the one or more sensors 134 track the sun like the photovoltaic members, and are optionally coupled with the photovoltaic members, and can be used to collect data on a current tracked, real time irradiance. In a further option, the one or more sensors 134 include multiple fixed irradiance sensors which are fixed relative to the site. The fixed sensors 134, in an option, are disposed in multiple orientations, such as shown in FIG. 3, and sense a current irradiance in multiple radial positions. For instance, the fixed sensors 134 include sensors mounted at five degree intervals. In another option, the fixed sensors 134 can be mounted in two degree intervals. In yet another option, the one or more sensors 134 is a single fixed sensor 136, as shown in FIG. 1. The single fixed sensor 136 is non-rotated and is generally in a horizontal position. For a tilted single axis tracker, the fixed sensor would be mounted in the non-rotated position of the tracker, but with the same or similar azimuthal orientation as the photovoltaic member. In another option, the irradiance can be determined from a short circuit current of the photovoltaic members.

The processor 132 is configured to calculate a predicted irradiance for multiple orientations of the photovoltaic array, where the predicted irradiance is determined from site specific data and real-time sensed field data. The processor 132 is further configured to calculate a maximum predicted irradiance from the predicted irradiance for multiple orientations. For example, the processor 132 calculates irradiance for multiple rotational orientations given the location and the local weather conditions and determines an orientation which maximizes the irradiance. The processor 132 is configured to compare the maximum predicted irradiance with a current tracked irradiance. For example, in diffuse weather conditions where a cloud is in front of the sun, the maximum predicted irradiance may indicate an orientation for the photovoltaic members that is different than an orientation which tracks the sun.

If the maximum predicted irradiance is greater than the current tracked irradiance, the processor 132 communicates an orientation to the tracker controller 120 based on the maximum predicated irradiance. This will increase energy production of tracking photovoltaic arrays because it accounts for conditions, such as cloud cover, which may affect a maximized orientation for the photovoltaic members. In an option, a low pass filter will only send instructions for the tracker controller to change the position of the photovoltaic members if the maximum predicted irradiance is greater than the current tracked irradiance for a certain period time, e.g. two-five minutes, in order to prevent re-orienting the photovoltaic members for a temporary condition, such as, but not limited to, a passing cloud. It should be noted that the low pass filter could be based on other periods of time, or events, or based on other information such as, but not limited to, weather forecast information.

Figure 4:
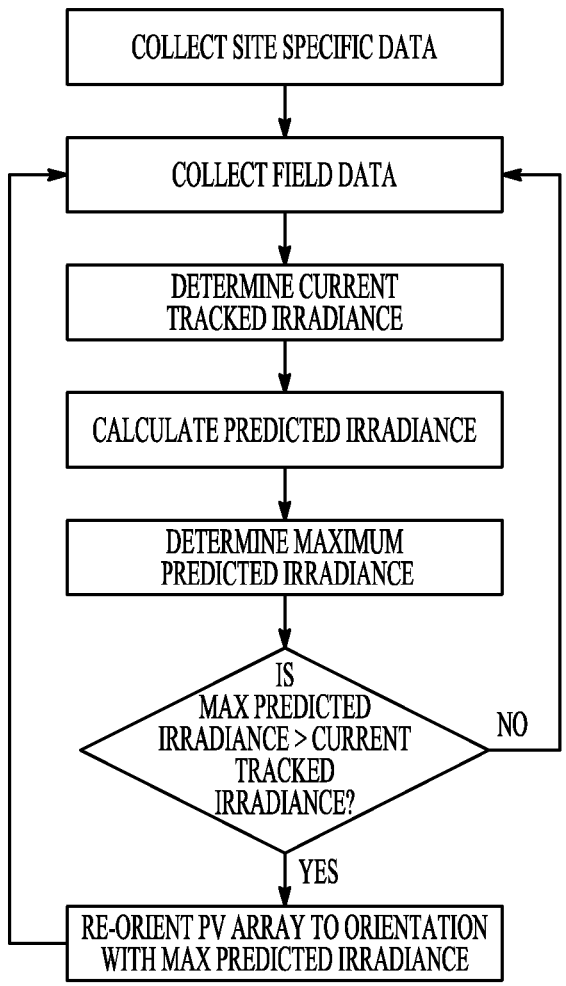
FIG. 4 illustrates a flow diagram for a method according to one or more embodiments.

Referring to FIG. 4, a method includes collecting site specific data, for instance at a server. For example, the site specific data includes data related to information regarding latitude, longitude, elevation, time zone, or Linke turbidity. The method further includes collecting field data at a site of an array of photovoltaic members, for instance the photovoltaic members 110 discussed above. The field data includes, but is not limited to, relative humidity, ambient temperature, or horizontal irradiance. The method further includes determining a current tracked irradiance of the array of photovoltaic members. For instance, a sensor associated with the tracker controller is used to sense a current irradiance reading by following or tracking the sun.

A predicated irradiance reading can be calculated for multiple orientations based on the site specific data and the sensed field data. For instance, a processor can be used to run calculations based on input for a variety of factors, including, but not limited to, relative humidity, or ambient temperature, future weather forecasts, or combinations thereof. This allows for a more accurate determination of the irradiance in a non-tracked position, which may or may not be greater than a tracked irradiance. This further allows for the system to take into account other factors which may affect irradiance, such as, but not limited to, cloud cover. The method further includes determining a maximum predicted irradiance from the calculated predicted irradiance, for example by sorting the data. The orientation of the photovoltaic array is noted for where the maximum predicted irradiance would occur. The method further includes comparing the maximum predicted irradiance with the current tracked irradiance. If the maximum predicted irradiance is greater than the actual, current tracked irradiance, the array of photovoltaic members are re-oriented the orientation having the maximum predicted irradiance. In an option, the photovoltaic members are not re-oriented until a period of time passes with an unchanged calculation. For instance, the system waits to determine if a cloud over the sun temporarily affects the irradiance levels. The system can further take into account the speed of movement between orientations of the photovoltaic members. For example, if the maximum predicted irradiance orientation is at a position that requires several minutes to rotate to, the system can wait to ensure the change is not temporary before changing orientations.

In another option, the system can take into account other sensor readings and/or information which may indicate that the maximum predicted irradiance is only a temporary condition, or other factors which may affect the calculation of the predicted irradiance. For instance, an event may trigger the collection of additional information. For example, an occurrence of an event, such as, but not limited to, may include a change in one or more of relative humidity, ambient temperature, or sensed irradiance.

Once the maximum predicated irradiance and maximum predicted irradiance orientation has been determined, and optionally that it is not a temporary condition, instructions are transmitted to the tracker controller. For instance, in an option, instructions regarding the rotational orientation of the array of the photovoltaic members with the maximum predicted irradiance are transmitted to a tracker controller coupled with the array of photovoltaic members, and optionally the orientation of the photovoltaic members are modified, for example by the tracker controller.

In yet another option, the method further includes sensing current irradiance from two or more fixed irradiance sensors, where the two or more fixed irradiance sensors are fixed relative to the site, determining a maximum current irradiance from the current sensed irradiance, comparing the maximum current irradiance with the current sensed irradiance, and re-orienting the array of photovoltaic members to an orientation having the maximum predicted irradiance if the maximum predicted irradiance is greater than the current tracked irradiance.

Figure 5:
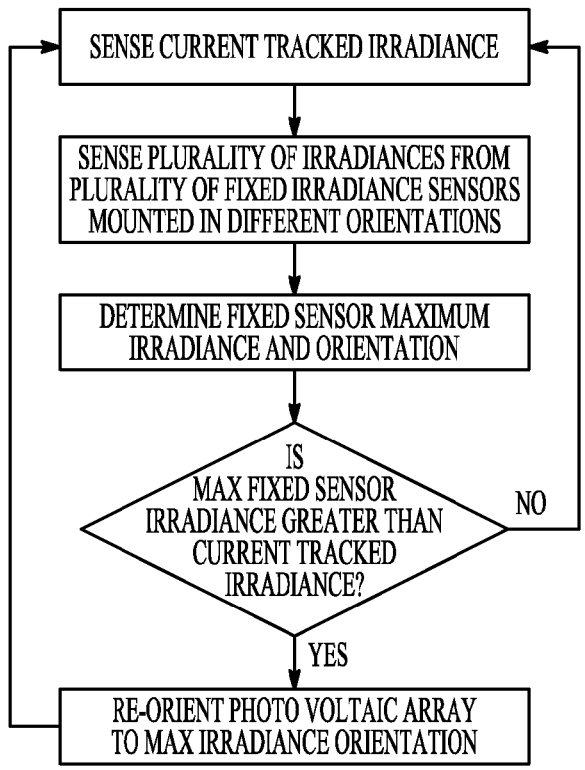
FIG. 5 illustrates a flow diagram for a method according to one or more embodiments.
Figure 6:
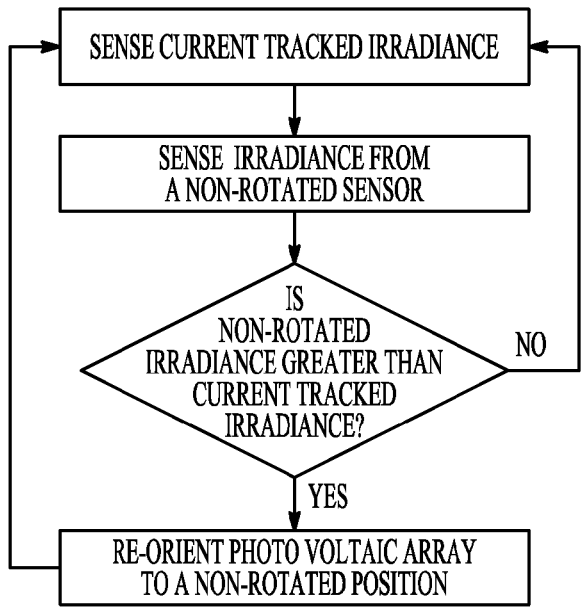
FIG. 6 illustrates a flow diagram for a method according to one or more embodiments.

FIGS. 5 and 6 illustrate additional methods. A method includes rotating an array of photovoltaic members at a site including tracking movement of the sun, sensing a current tracked irradiance of the rotating array of photovoltaic members, and sensing at least one irradiance reading from at least one irradiance sensor. For instance, in an option, it is sensed from at least one non-rotated sensor 136, as shown in FIG. 1. In another option, a plurality of irradiance readings are sensed from a plurality of fixed irradiance sensors 134, where the fixed irradiance sensors are mounted at different rotational orientations, as shown in FIG. 3. The sensors 134 are mounted at fixed intervals of rotation, and the method optionally includes sensing a plurality of irradiance readings from fixed irradiance sensors spaced at 2 degree intervals. Any number of sensors and intervals can be used. In a further option, the method further includes interpolating irradiance readings between two adjacent fixed irradiance sensors to provide additional data for calculating a maximum irradiance.

The method further includes determining a maximum irradiance and maximized irradiance orientation from the one or more of irradiance readings from the fixed sensors, and re-orienting the array of photovoltaic members to the maximized irradiance orientation if the maximized irradiance is greater than the current tracked irradiance. For instance, if the non-rotated sensor has a greater irradiance reading than the tracked irradiance reading, the tracker controller would re-orient the photovoltaic member to the 'flat' or non-oriented position. In an option, the method further includes collecting additional information at the site based upon occurrence of an event, and the occurrence of the event includes a change in one or more of relative humidity, or ambient temperature. The change could be monitored for a determined change in humidity or temperature, and re-calculating the maximum predicted irradiance.

In an option, the photovoltaic members are not re-oriented until a pre-determined period of time passes with an unchanged calculation. For instance, the system waits to determine if a cloud over the sun temporarily affects the irradiance levels. The system can further take into account the speed of movement between orientations of the photovoltaic members. For example, if the maximum sensed irradiance orientation is at a position that requires several minutes to rotate to, the system can wait to ensure the change is not temporary before changing orientations.

In another option, the method collect additional information at the site based upon occurrence of an event. For example, an occurrence of an event, such as, but not limited to, may include a change in one or more of relative humidity, or ambient temperature.

In yet another option, the method further includes calculating a predicted maximum irradiance, comparing the predicted maximum irradiance with the maximum irradiance, re-orienting the array of photovoltaic members if the predicted maximum irradiance is greater than the maximum irradiance, as further discussed above.

The systems, apparatus, and methods discussed herein allow for an opportunity to maximize the energy collected, particularly during diffuse weather conditions, for instance when clouds cover the sun. Rather than minimizing the angle of incidence between the normal to the tracker or photovoltaic member and the collimated solar rays hitting the surface of the tracker, the method and systems orients the tracker such that the plane of array irradiance is maximized, and can further take into account current weather conditions.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above description is intended to be illustrative, and not restrictive. For instance, any of the aforementioned examples may be used individually or with any of the other examples. Many other embodiments may be apparent to those of skill in the art upon reviewing the above description. The scope of the present assemblies and methods should, therefore, be determined with reference to the appended claims, along with the full scope of legal equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, assembly, article, or process that includes elements in addition to those listed after such a term in a claim are still deemed to fall within the scope of such claim.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A method comprising:
collecting site specific data;
collecting field data at a site of an array of photovoltaic members;
determining a current tracked irradiance of the array of photovoltaic members;
calculating a predicted irradiance for multiple orientations based on the site specific data and the field data;
determining a maximum predicted irradiance from the calculated predicted irradiance;
comparing the maximum predicted irradiance with the current tracked irradiance; and
re-orienting the array of photovoltaic members to an orientation having the maximum predicted irradiance if the maximum predicted irradiance is greater than the current tracked irradiance.

2. The method as recited in claim 1, further comprising transmitting instructions regarding rotational orientation of the array of photovoltaic members to a tracker controller coupled with the array of photovoltaic members.

3. The method as recited in claim 1, further comprising modifying an orientation of the photovoltaic members with a tracker controller.

4. The method as recited in claim 1, further comprising collecting additional information at the site based upon occurrence of an event.

5. The method as recited in claim 4, wherein the occurrence of the event includes a change in one or more of relative humidity, ambient temperature, or sensed irradiance.

6. The method as recited in claim 1, further comprising waiting to re-orient the array of photovoltaic members until the maximized predicted irradiance is greater than the current tracked irradiance for a pre-determined amount of time.

7. The method as recited in claim 1, wherein collecting field data includes sensing data on at least one of relative humidity, ambient temperature, or horizontal irradiance.

8. The method as recited in claim 1, wherein the site specific data includes information regarding latitude, longitude, elevation, time zone, or Linke turbidity.

9. The method as recited in claim 1, further comprising sensing current irradiance from two or more fixed irradiance sensors, where the two or more fixed irradiance sensors are fixed relative to the site, determining a maximum current irradiance from the current sensed irradiance, comparing the maximum current irradiance with the current sensed irradiance, and re-orienting the array of photovoltaic members to an orientation having the maximum predicted irradiance if the maximum predicted irradiance is greater than the current tracked irradiance.

10. A method comprising:
rotating an array of photovoltaic members to track movement of the sun, where the array of photovoltaic members are located at a site;
sensing a current tracked irradiance of the rotating array of photovoltaic members;
sensing a plurality of irradiance readings from a plurality of fixed irradiance sensors, wherein the fixed irradiance sensors are mounted at different rotational orientations relative to the site;
determining a maximum irradiance and maximized irradiance orientation from the plurality of irradiance readings; and
re-orienting the array of photovoltaic members to the maximized irradiance orientation if the maximized irradiance is greater than the current tracked irradiance.

11. The method as recited in claim 10, wherein sensing the plurality of irradiance readings from the plurality of fixed irradiance sensors includes sensing irradiance from fixed irradiance sensors spaced at 2 degree intervals.

12. The method as recited in claim 10, further comprising interpolating irradiance readings between two adjacent fixed irradiance sensors.

13. The method as recited in claim 10, further comprising calculating a predicted maximum irradiance, comparing the predicted maximum irradiance with the maximum irradiance, re-orienting the array of photovoltaic members if the predicted maximum irradiance is greater than the maximum irradiance.

14. The method as recited in claim 10, further comprising collecting additional information at the site based upon occurrence of an event.

15. The method as recited in claim 14, wherein the occurrence of the event includes a change in one or more of relative humidity, ambient temperature, or sensed irradiance.

16. The method as recited in claim 10, further comprising waiting to re-orient the array of photovoltaic members until the maximized predicted irradiance is greater than the current tracked irradiance for a pre-determined amount of time.

17. A method comprising:
rotating an array of photovoltaic members to track movement of the sun, where the array of photovoltaic members are located at a site;
sensing a current tracked irradiance of the rotating array of photovoltaic members;
sensing at least one irradiance reading from at least one non-rotated fixed irradiance sensor, wherein the fixed irradiance sensor(s) are mounted at different rotational orientations relative to the site;
re-orienting the array of photovoltaic members to a non-rotated position if the at least one irradiance reading is greater than the current tracked irradiance.

18. The method as recited in claim 17, further comprising calculating a predicted maximum irradiance, comparing the predicted maximum irradiance with the maximum irradiance, re-orienting the array of photovoltaic members if the predicted maximum irradiance is greater than the at least one irradiance reading.

19. The method as recited in claim 17, further comprising collecting additional information at the site based upon occurrence of an event, and the occurrence of the event includes a change in one or more of relative humidity, ambient temperature, or sensed irradiance.

20. The method as recited in claim 17, further comprising waiting to re-orient the array of photovoltaic members until the maximized predicted irradiance is greater than the current tracked irradiance for a pre-determined amount of time.

* * * * *